United States Patent
Yamaguchi

(10) Patent No.: US 7,916,497 B2
(45) Date of Patent: *Mar. 29, 2011

(54) PRINTED CIRCUIT BOARD AND DIFFERENTIAL SIGNALING STRUCTURE

(75) Inventor: Hiroyuki Yamaguchi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/437,514

(22) Filed: May 7, 2009

(65) Prior Publication Data

US 2009/0224798 A1 Sep. 10, 2009

Related U.S. Application Data

(62) Division of application No. 11/486,089, filed on Jul. 14, 2006, now Pat. No. 7,545,652.

(30) Foreign Application Priority Data

Jul. 20, 2005 (JP) ................. 2005-209881
Jul. 6, 2006 (JP) ................. 2006-186912

(51) Int. Cl.
*H05K 1/18* (2006.01)
(52) U.S. Cl. .................. 361/778; 361/760; 361/761
(58) Field of Classification Search ............. 361/778, 361/761, 763; 174/74 R; 326/30, 86; 333/4, 333/5, 33

See application file for complete search history.

(56) References Cited

U.S. PATENT DOCUMENTS

| | | | |
|---|---|---|---|
| 6,208,161 B1 | 3/2001 | Suda | |
| 6,744,280 B2 | 6/2004 | Morgan et al. | |
| 7,049,901 B2 * | 5/2006 | Sacco | 333/4 |
| 7,102,380 B2 | 9/2006 | Kao | |
| 7,113,002 B2 | 9/2006 | Otsuka et al. | |
| 7,148,428 B2 * | 12/2006 | Meier et al. | 174/260 |
| 7,545,652 B2 * | 6/2009 | Yamaguchi | 361/778 |
| 7,609,125 B2 * | 10/2009 | van Quach et al. | 333/5 |
| 2004/0094328 A1 * | 5/2004 | Fjelstad et al. | 174/251 |

FOREIGN PATENT DOCUMENTS

| | | |
|---|---|---|
| JP | 11-205118 | 7/1999 |
| JP | 2001-7458 | 1/2001 |

* cited by examiner

*Primary Examiner* — Yuriy Semenenko
(74) *Attorney, Agent, or Firm* — Fitzpatrick, Cella, Harper & Scinto

(57) ABSTRACT

Provided is a system adopting a differential signaling system including a low frequency signaling line arranged to be adjacent to a pair of differential signaling lines in parallel to each other, for transmitting a signal having a frequency which is smaller than a frequency of a signal to be transmitted through the pair of differential signaling lines, in which a transmission end of the low frequency signaling line is connected to a ground pattern through a first capacitive element, and a reception end of the low frequency signaling line is connected to the ground pattern through a second capacitive element. Thus, it is possible to provide, easily and at a low cost, a differential signaling system in which a common mode noise is eliminated without increasing the number of pins.

12 Claims, 9 Drawing Sheets

PRINTED CIRCUIT BOARD AND DIFFERENTIAL SIGNALING STRUCTURE

This application is a divisional of U.S. patent application Ser. No. 11/486,089, filed Jul. 14, 2006, the contents of which are incorporated by reference herein.

BACKGROUND OF THE INVENTION

1. Field of the Invention

The present invention relates to a differential signaling structure adopting a differential signaling system, in which a radiation noise from an electronic instrument is reduced.

2. Related Background Art

In recent years, in a signal transmission between electronic instruments, it is necessary to improve a data transmission rate so as to be compatible with a high-speed operation of the electric instruments. To improve the data transmission rate, there are required a higher frequency of a signal to be transmitted and a higher switching speed of the devices used for the signal transmission. To comply with the higher frequency and the higher speed of the signal to be transmitted, it is necessary to take measures against radiation noises. For this reason, a differential signaling system has been used in place of a conventional signaling system of a single-ended signaling system. In particular, a low voltage differential signaling (LVDS) system has a great effect in reducing the radiation noises because a signal wave form thereof is a low-amplitude voltage, in addition to the effect of canceling magnetic fields generated by anti-phase currents flowing through a differential signal pair with other.

FIG. 8 is a schematic diagram showing a general circuit structure adopting the LVDS system. In FIG. 8, reference numeral 1000 denotes a printed circuit board, reference numeral 100 denotes a transmission side circuit element, reference numeral 101 denotes a reception side circuit element, and reference numeral 300 denotes a ground pattern. Reference numeral 1001 denotes a printed wiring board, and the transmission side circuit element 100 and the reception side circuit element 101 are mounted on the printed wiring board 1001. Between the transmission side circuit element 100 and the reception side circuit element 101, a differential signaling line 8 is arranged by providing signaling lines 1 and 2 that have the same electrical characteristics, thereby performing differential signaling with a low-amplitude voltage.

A terminating resistor 3 having a value substantially equal to a differential impedance of the differential signaling line is provided between in the vicinity of input terminals of the reception side circuit element 101 and connected to the signaling lines 1 and 2. By providing the terminating resistor 3, the entire anti-phase currents flowing through the signaling lines 1 and 2 are thermally consumed, thereby making it possible to suppress the distortion of a wave form and the generation of radiation noises due to reflection. The signaling lines 1 and 2 are arranged to be adjacent in substantially parallel to each other and have the same length. As a result, the anti-phase currents flowing through the signaling lines 1 and 2 generate magnetic fields having substantially the same quantity in opposite directions to be cancelled out, thereby making it possible to suppress generation of the radiation noises.

In FIG. 8, in addition to the differential signaling line 8 for transmitting a high frequency signal, there are provided three low frequency signaling lines 4, 5 and 6, and a ground line 7. The low frequency signaling lines 4, 5, and 6 are connected to the transmission side circuit elements 200, 202 and 204, respectively, and to the reception side circuit elements 201, 203 and 205, respectively, and transmit a signal having an extremely small frequency as compared with the differential signaling line 8. The signal transmitted through the low frequency signaling lines 4, 5 and 6 have a small frequency, so that the radiation noise is not a problem even by adopting the transmission system of the single-ended signaling system. Both ends of the ground pattern line 7 each are connected to a ground pattern 300, and the ground line 7 constitutes return paths for the differential signaling line 8 and the low frequency signaling lines 4, 5 and 6.

The differential signaling system represented by the LVDS system is effective in reducing the radiation noises due to the high frequency signal. However, to comply with the higher frequency and the higher speed of the signal, a standard for the radiation noises becomes more stringent year after year, so that the differential signaling system is not sufficient enough to deal with the radiation noises.

Even when two signaling lines of the differential signaling line are designed to have completely the same electrical characteristics, an in-phase current component is generated in the differential signaling line due to a time lag within the transmission side circuit element, a difference between build up and build down characteristics thereof, and the like. The differential signaling system is effective for an anti-phase signal, but not capable of suppressing the radiation noises generated due to an in-phase signal. The radiation noise generated in the differential signaling line due to the in-phase current component is called a common mode noise.

In a case of a circuit structure shown in FIG. 8, the in-phase current component flows through the differential signaling line 8, thereby generating the common mode noise. With regard to the in-phase current component flowing from the transmission side circuit element 100 to the reception side circuit element 101, there is no path through which the in-phase current component flows past the reception side circuit element 101. As a result, the in-phase current component returns to the transmission side circuit element 100 through a stray capacitance and the like of the printed wiring board while straying, whereby the radiation noises is generated.

Japanese Patent Application Laid-Open No. H11-205118 proposes an application of a center tap terminal circuit to a differential signaling system shown in FIG. 9. In FIG. 9, reference numerals 10 and 11 denote resistors which are designed to have about a half value of a differential impedance of a differential signaling line. The resistors 10 and 11 are connected in series to signaling lines 1 and 2 between the signaling lines 1 and 2 in the vicinity of input terminals of the reception side circuit element 101. Reference numeral 12 is a capacitor provided between a connection point of the resistors 10 and 11 connected in series and a ground pattern 300 to connect the connection point to the ground pattern. An in-phase current component generated in the differential signaling lines 1 and 2 flows to the ground pattern 300 through the resistors 10 and 11 having the same value, and the capacitor 12. Then, the in-phase current component returns to a reception side circuit element 100 through a ground line 7, which is connected to the ground pattern, as a return path. Thus, it is possible to suppress the radiation noise.

Japanese Patent Application Laid-Open No. 2001-007458 proposes an application of a center tap terminal circuit to a differential signaling system shown in FIG. 10. In FIG. 10, the radiation noise is reduced by devising an arrangement of in-phase current components and ground lines which become return paths for the current components. In FIG. 10, reference numerals 13 and 14 denote ground lines that are newly provided to be adjacent to and in substantially parallel to signaling lines 1 and 2, and that are each connected to the ground pattern 300. With this structure, the in-phase current components generated in the signaling lines 1 and 2 flow through a center tap terminal constituted of the resistors 10 and 11 and the capacitor 12, and then returns to the reception side circuit element 100 through the two ground lines 13 and 14. In this case, the magnetic fields generated by the in-phase current component flowing through the signaling lines 1 and 2 and the magnetic fields generated by the return current flowing through the ground lines 13 and 14 cancel out each other in the vicinity of a pole, thereby making it possible to reduce the radiation noise.

However, in the case of the differential signaling system shown in FIG. 9, when the ground line 7 serving as the return path for the in-phase current is apart from the signaling lines 1 and 2, a current loop becomes large. As a result, the effect of reducing the radiation noise is not obtained sufficiently.

In addition, in the case of the differential signaling system shown in FIG. 10, it is necessary to add two ground lines each time of adding a pair of differential signaling lines. This increases the number of connector pins and cable cores. Further, this causes an increase in packing density and contour size of a printed wiring board on which the connector is mounted, an increase in cross-sectional area of the cable, and the like, thereby increasing a manufacturing cost of a circuit, and preventing an electric instrument from being small-sized. A higher speed system requires more lines which need to be switched to the differential signaling system, thereby making the problems more serious.

SUMMARY OF THE INVENTION

Therefore, an object of the present invention is to provide, easily and at a low cost, a structure for reducing radiation noise adopting a differential signaling system, in which the problem of the radiation noise inherent to the differential signaling system can be solved without increasing the number of pins, in a signal transmission between electric instruments, in a case where the differential signaling system is carried out in order to reduce the radiation noise in association with an increase in frequency and device switching speed for improvement of a data transmission rate.

To solve the above-mentioned problems, the present invention provides a differential signaling structure including: a pair of differential signaling lines provided between a transmission side circuit element and a reception side circuit element; and a low frequency signaling line arranged to be adjacent to and in parallel to the differential signaling lines, for transmitting a signal having a frequency smaller than a frequency of a signal to be transmitted through the differential signaling lines, in which a transmission end of the low frequency signaling line is connected to a ground pattern through a first capacitive element, and a reception end of the low frequency signaling line is connected to the ground pattern through a second capacitive element.

Further, the present invention provides a differential signaling structure including: a pair of differential signaling lines provided between the transmission side circuit element and the reception side circuit element; and a low frequency signaling line arranged to be adjacent to and in parallel to the differential signaling lines, for transmitting a signal having a frequency smaller than a frequency of a signal to be transmitted through the differential signaling lines, in which, in the vicinity of an input terminal of the reception side circuit element of the pair of differential signaling lines, two resistors are arranged which are connected in series to the pair of differential signaling lines, and which have a resistance value that is about a half of a resistance value matching a differential impedance; the second capacitive element is connected between a connection point of the two resistors connected in series with each other and the transmission end of the low frequency signaling line; and the reception end of the low frequency signaling line is connected to the ground pattern through a third capacitive element.

Further, the present invention provides a printed circuit board including: a pair of differential signaling lines provided between a transmission side circuit element and a reception side circuit element; and a low frequency signaling line arranged to be adjacent to and in parallel to the differential signaling lines, for transmitting a signal having a frequency smaller than a frequency of the signal to be transmitted through the differential signaling lines, wherein a transmission end of the low frequency signaling line is connected to the ground pattern through the first capacitive element, and a reception end of the low frequency signaling line is connected to the ground pattern through the second capacitive element.

The above and other objects of the invention will become more apparent from the following description taken in conjunction with the accompanying drawings.

DESCRIPTION OF THE PREFERRED EMBODIMENTS

Hereinafter, the present invention will be described with reference to the drawings.

First Embodiment

Figure 1:
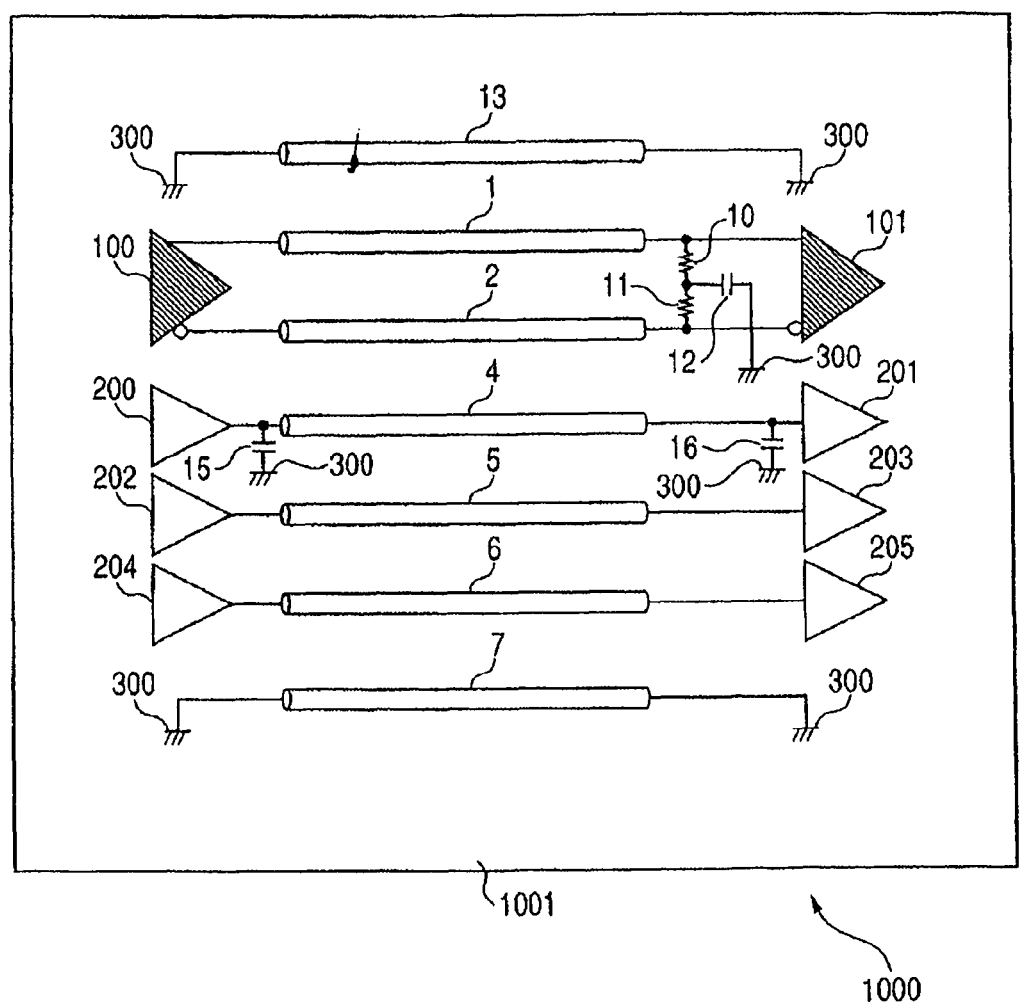
FIG. 1 is a schematic diagram showing a circuit structure adopting a differential signaling system according to a first embodiment of the present invention.
Figure 8:
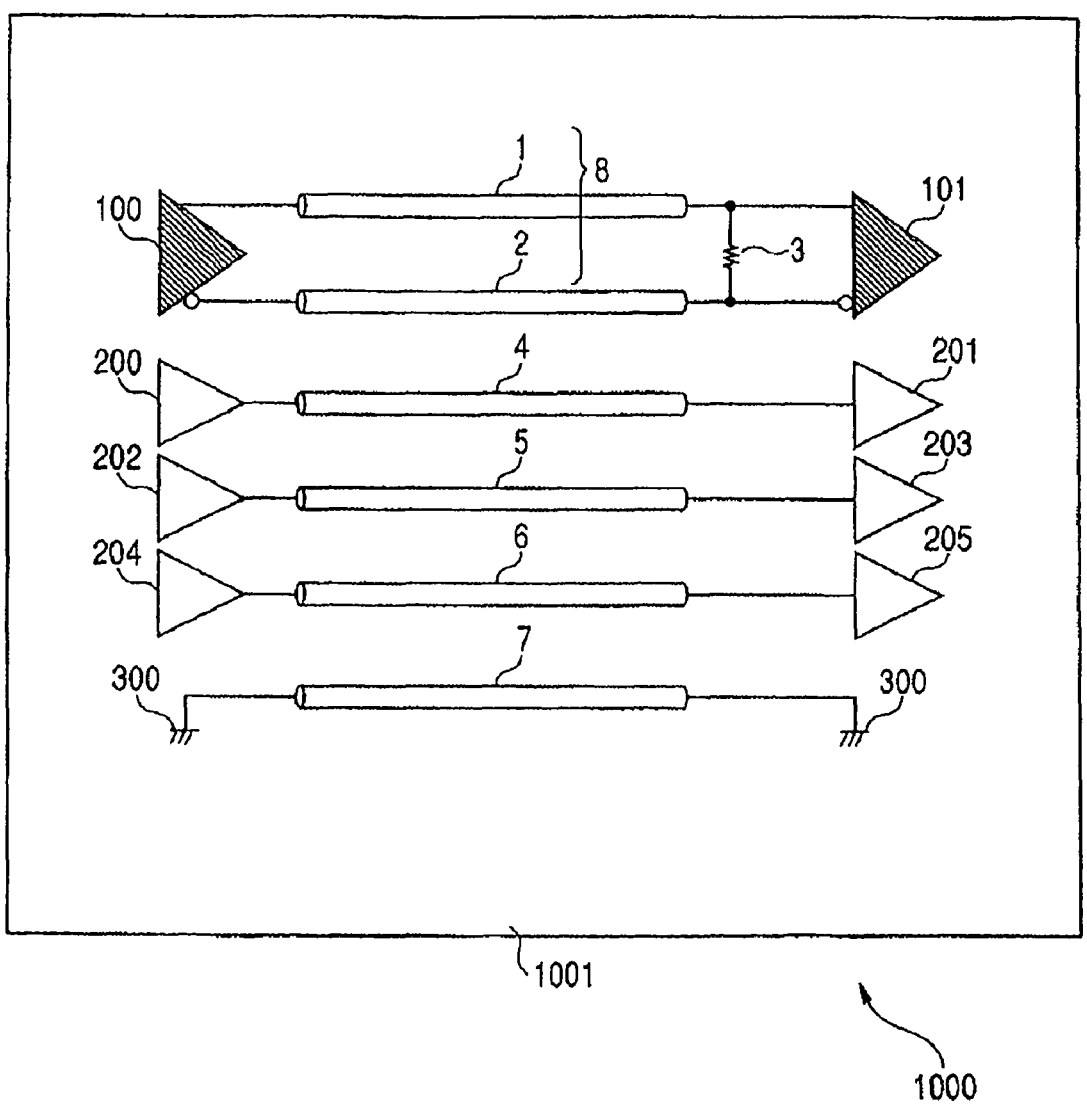
FIG. 8 is a schematic diagram showing a conventional circuit structure.

FIG. 1 is a schematic diagram showing a circuit structure according to a first embodiment of the present invention. It should be noted that the same reference numerals are given to the members which are the same as those of FIGS. 8, 9 and 10. In this embodiment, only the parts different from prior arts will be described.

Figure 10:
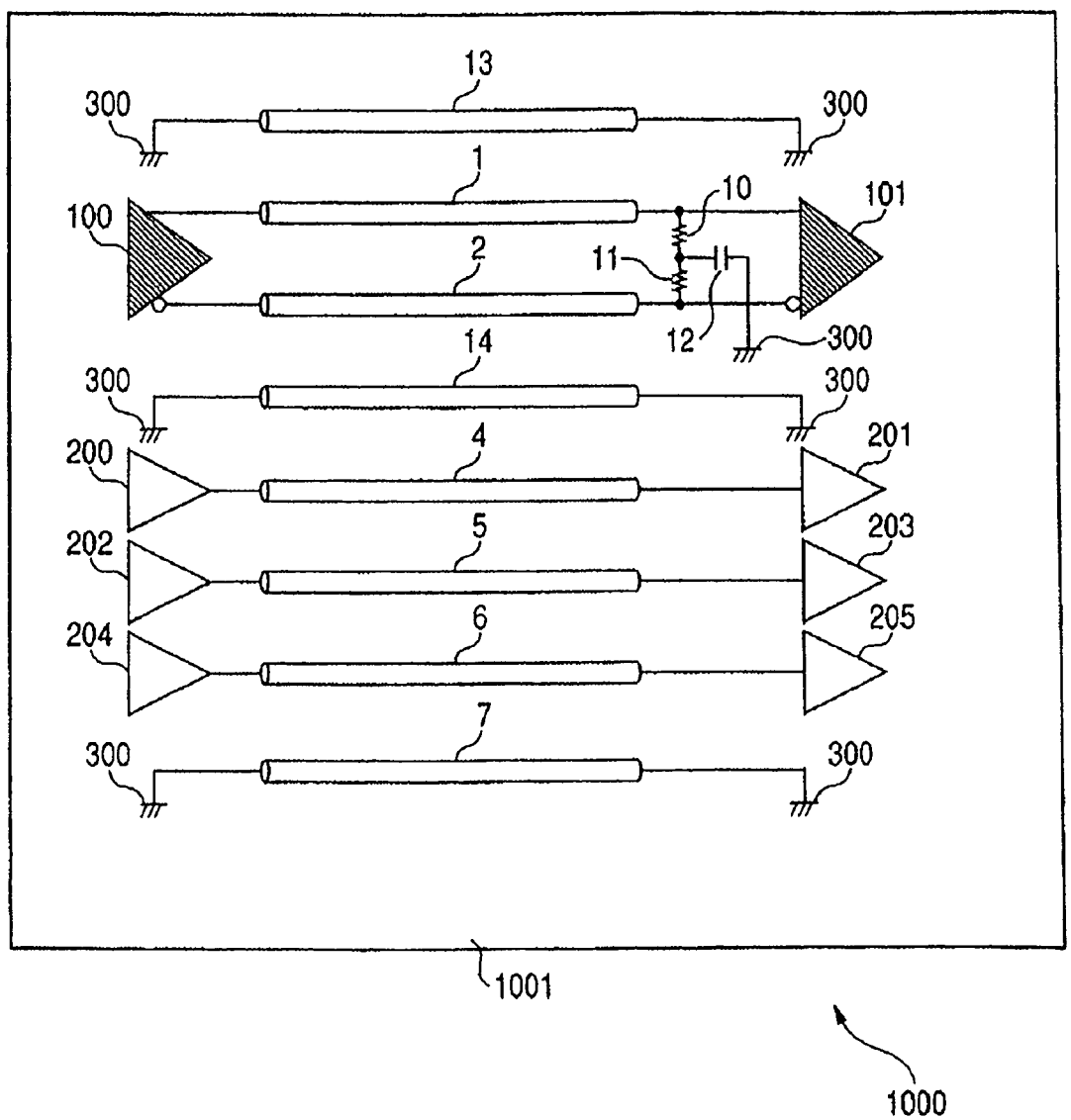
FIG. 10 is a schematic diagram showing the conventional circuit structure.

In FIG. 1, reference numeral 15 denotes a capacitor which is provided so as to connect the vicinity of an output terminal of a transmission side circuit element 200 of a low frequency signaling line 4 and a ground pattern 300 to each other, and reference numeral 16 denotes a capacitor which is provided so as to connect the vicinity of an input terminal of a reception side circuit element 201 of the low frequency signaling line 4 and the ground pattern 300 to each other. Referring to FIG. 10 for comparison, a ground line 14 arranged to be adjacent to one side of a signaling line 2 constituting a differential signaling line is removed, and the low frequency signaling line 4 is arranged in its position, that is, to be adjacent to and in substantially parallel to the signaling line 2. With this structure, an in-phase current component flowing through differential signaling lines 1 and 2 reaches the ground pattern 300 through resistors 10 and 11 and a capacitor 12. Further, the in-phase current component returns to a reception side circuit element 100 through a ground line 13, and at the same time, returns to the reception side circuit element 100 through the capacitor 16, the low frequency signaling line 4, and the capacitor 15. In this case, the magnetic field generated by the in-phase current component flowing through the differential signaling lines 1 and 2 and the magnetic field generated by a return current flowing through the ground line 13 and the low frequency signaling line 4 cancel out each other in the vicinity of a pole, thereby making it possible to suppress generation of radiation noise.

At this time, through the low frequency signaling line 4, a low frequency signal is transmitted from the transmission side circuit element 200 to the reception side circuit element 201. As a result, it is necessary that the return current is caused to flow in a state where the return current does not substantially affect the low frequency signal. In the low frequency signal, when a voltage of the signal to be transmitted from the transmission side circuit element 200 is suppressed to an attenuation factor of 10% or less at the reception side circuit element 201, a failure in signal transmission is not caused.

Figure 2:
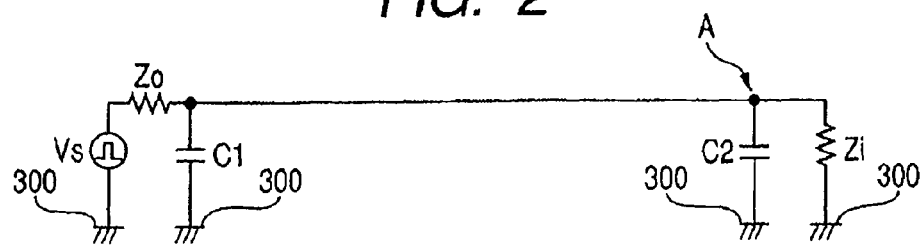
FIG. 2 is a schematic diagram showing the circuit structure adopting the differential signaling system according to the first embodiment of the present invention.

FIG. 2 is a schematic diagram showing a circuit structure of the low frequency signaling line 4. In FIG. 2, reference symbol Vs denotes a signal source of a transmission side circuit element 200 of a low frequency signal, and reference symbol Zo denotes an output impedance of a transmission side circuit element 200 of a low frequency signal. A point A denotes a signal reception terminal of the reception side circuit element 201. A voltage generated when a voltage of the signal source Vs is received at the signal reception terminal A is determined by an input impedance Zi of the reception side circuit element 201 and by an impedance caused when capacitors C1 and C2 are connected in parallel with each other. The impedance is reduced when the capacitors C1 and C2 are connected in parallel with each other, so that a voltage amplitude is reduced as compared with a case of an input impedance Zi in absence of the capacitors C1 and C2.

Assuming that a minimum pulse width of the signal to be transmitted through the low frequency signaling line 4 is set to τmin, a frequency of the signal to be transmitted is represented as the following reciprocal which is a reciprocal of twice the minimum pulse width τmin:

$$1/(2 \times \tau min) \quad \text{Formula (1).}$$

Accordingly, within a bandwidth of equal to or less than the frequency indicated by Formula (1), it is sufficient that the attenuation factor of the voltage is set to equal to or less than 10%.

In general, in a CMOS-IC, the output impedance Zo is extremely small as compared with the input impedance Zi of the reception side circuit element 201 of a low frequency signal, and is represented as the following formula:

$$Zo \ll Zi \quad \text{Formula (2).}$$

Thus, in order to suppress the attenuation factor of the voltage amplitude to 10% or less, when it is assumed that the impedance of a parallel circuit including the capacitors C1 and C2 is Zc, it is sufficient that Zc is set to a value ten or more times Zi as represented by the following formula.

$$Zc > 10 \times Zi \quad \text{Formula (3).}$$

This is because a total impedance caused when Zi is connected in parallel with Zc is represented as the following formula:

$$(Zc \times Zi)/(Zc+Zi)=(10/11) \times Zi \quad \text{Formula (4)}$$

and the attenuation factor of the impedance becomes (10 μl), in other words, 10% or less. The impedance Zc of the parallel circuit including the capacitors C1 and C2 at the frequency of f is given by the following formula:

$$Zc=1/(2\pi \times f \times (C1+C2)) \quad \text{Formula (5).}$$

Then, f is obtained by substituting the frequency given by Formula (2) as represented by the following formula:

$$Zc=\tau min/(\pi \times (C1+C2)) \quad \text{Formula (6).}$$

When Formula (6) is substituted for Formula (3), the following formula can be obtained.

$$C1+C2 < ((\tau_{min})/(10 \times \pi \times Zi)) \quad \text{Formula (7).}$$

In other words, the total value of the C1 and C2 makes it a condition that Formula (7) is satisfied. Formula (7) determines a necessary condition for receiving the signal having the minimum pulse width τmin at the reception side circuit element 201 without a failure.

By setting such the condition, the attenuation factor of the wave form amplitude of the low frequency signal is suppressed to be reduced by 10% at a maximum, thereby making it possible to achieve reduction in radiation noise without causing any failures in operation.

Second Embodiment

Figure 3:
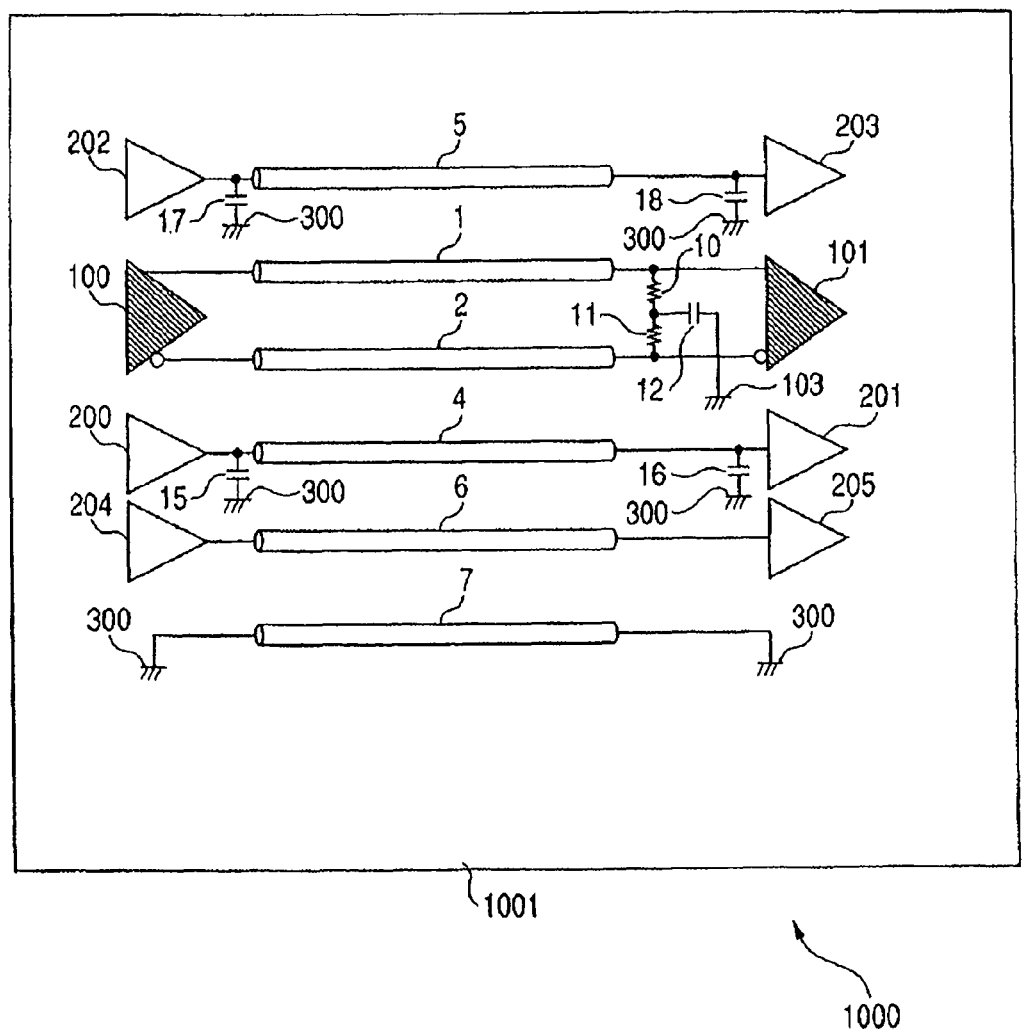
FIG. 3 is a schematic diagram showing a circuit structure adopting a differential signaling system according to a second embodiment of the present invention.

FIG. 3 is a schematic diagram showing a circuit structure according to a second embodiment of the present invention. It should be noted that the same reference numerals are given to the members which are the same as with those of FIG. 1 representing the first embodiment. In this embodiment, only the parts different from the first embodiment will be described.

In FIG. 3, reference numeral 17 denotes a capacitor which is provided so as to connect the vicinity of an output terminal of a transmission side circuit element 202 of a low frequency signaling line 5 and a ground pattern 300, and reference numeral 18 denotes a capacitor which is provided so as to connect the vicinity of an input terminal of a reception side circuit element 203 of the low frequency signaling line 5 and the ground pattern 300. The low frequency signaling line 5 is arranged to be adjacent to and in substantially parallel to a differential signaling line 1. In this case, the low frequency signaling lines 4 and 5 for carrying out the low frequency signaling have the same electrical characteristics, and are arranged such that each distance from the lines 4 and 5 to differential signaling lines 1 and 2 is set to be equal. In addition, a capacitor 15 and the capacitor 17 have the same capacitance value, and a capacitor 16 and the capacitor 18 also have the same capacitance value. With the above-mentioned structure, a return current of an in-phase current passing through the differential signaling lines 1 and 2 flows through each of the low frequency signaling lines 4 and 5 at the same level. As a result, the magnetic field generated by the in-phase current and the magnetic field generated by the return current cancel out each other in contrast to each other and in a balanced manner, thereby making it possible to further reduce the radiation noise.

It should be noted that each capacitance value of the capacitors 15, 16, 17 and 18 can be obtained in the same manner as in the first embodiment.

Third Embodiment

Figure 4:
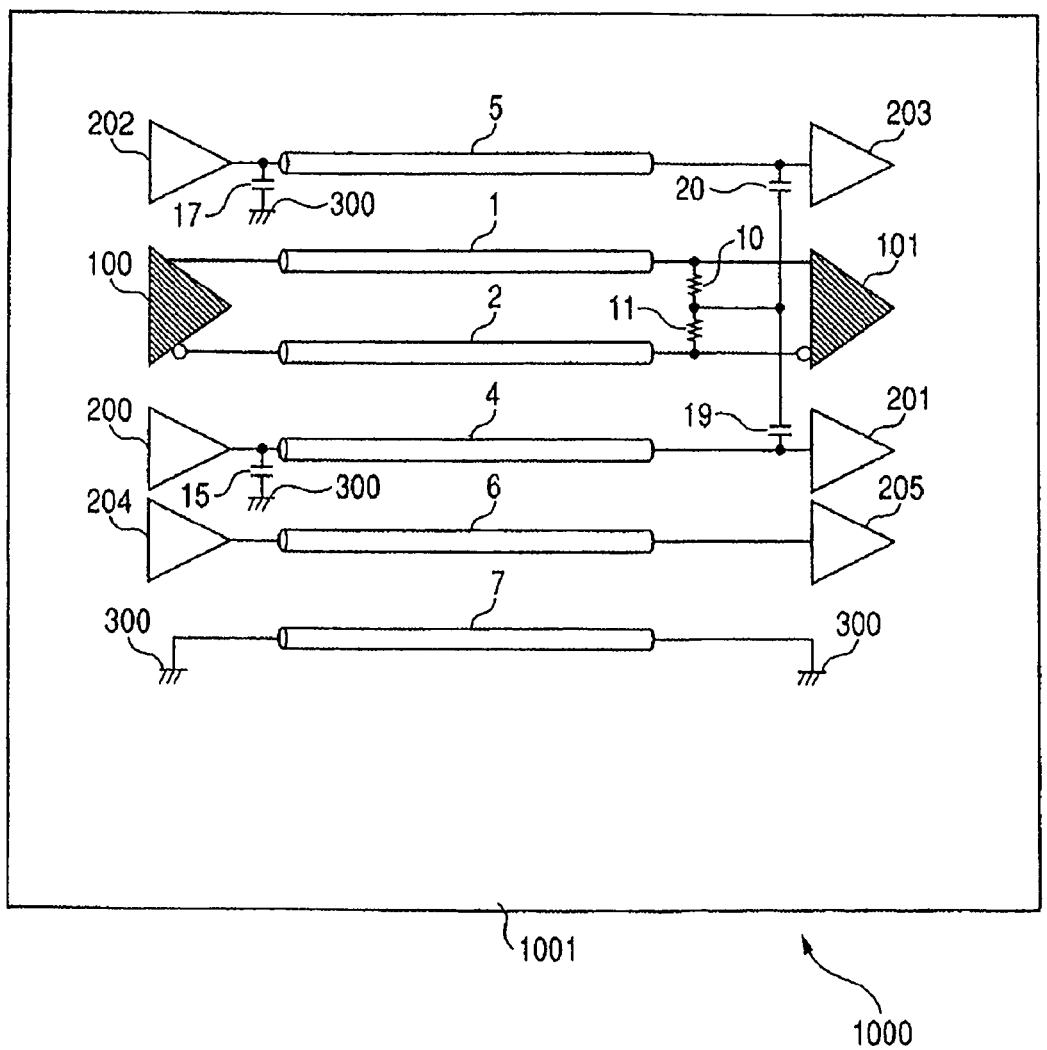
FIG. 4 is a schematic diagram showing a circuit structure adopting a differential signaling system according to a third embodiment of the present invention.

FIG. 4 is a schematic diagram showing a circuit structure according to a third embodiment of the present invention. It should be noted that the same reference numerals are given to the members which are the same as those of FIG. 3 representing the second embodiment. In this embodiment, only the parts different from the second embodiment will be described.

In FIG. 4, reference numeral 19 denotes a capacitor which is provided so as to connect the vicinity of an output terminal of a reception side circuit element 201 of a low frequency signaling line 4 and a midpoint between center tap terminating resistors 10 and 11, and reference numeral 20 denotes a capacitor which is provided so as to connect the vicinity of an input terminal of a reception side circuit element 203 of a low frequency signaling line 5 and the midpoint between the center tap terminating resistors 10 and 11. The low frequency signaling lines 4 and 5 are arranged to be adjacent to and in substantially parallel to differential signaling lines 1 and 2. A return current of an in-phase current flowing through the differential signaling lines 1 and 2 is divided in each direction of the capacitors 19 and 20 at the midpoint between the center tap terminating resistors 10 and 11. Further, the return current flows through the low frequency signaling lines 4 and 5 to a ground pattern 300 through capacitors 15 and 17, respectively, and then returns to a transmission side circuit element 100 of a differential signal.

With this structure, as compared with the second embodiment, even when the number of capacitors is reduced by one, the same effect of reducing the radiation noise can be obtained, thereby making it possible to reduce packaging area and the manufacturing cost.

It should be noted that each capacitance value of the capacitors 15, 17, 19 and 20 can be obtained in the same manner as in the first embodiment.

As the transmission side circuit elements 100, 200, 202 and 204 according to the first, second and third embodiments, various ICs may be used. In a similar manner, as the reception side circuit elements 101, 201, 203 and 205 according to the first, second and third embodiments, various ICs may be used.

Figure 5:
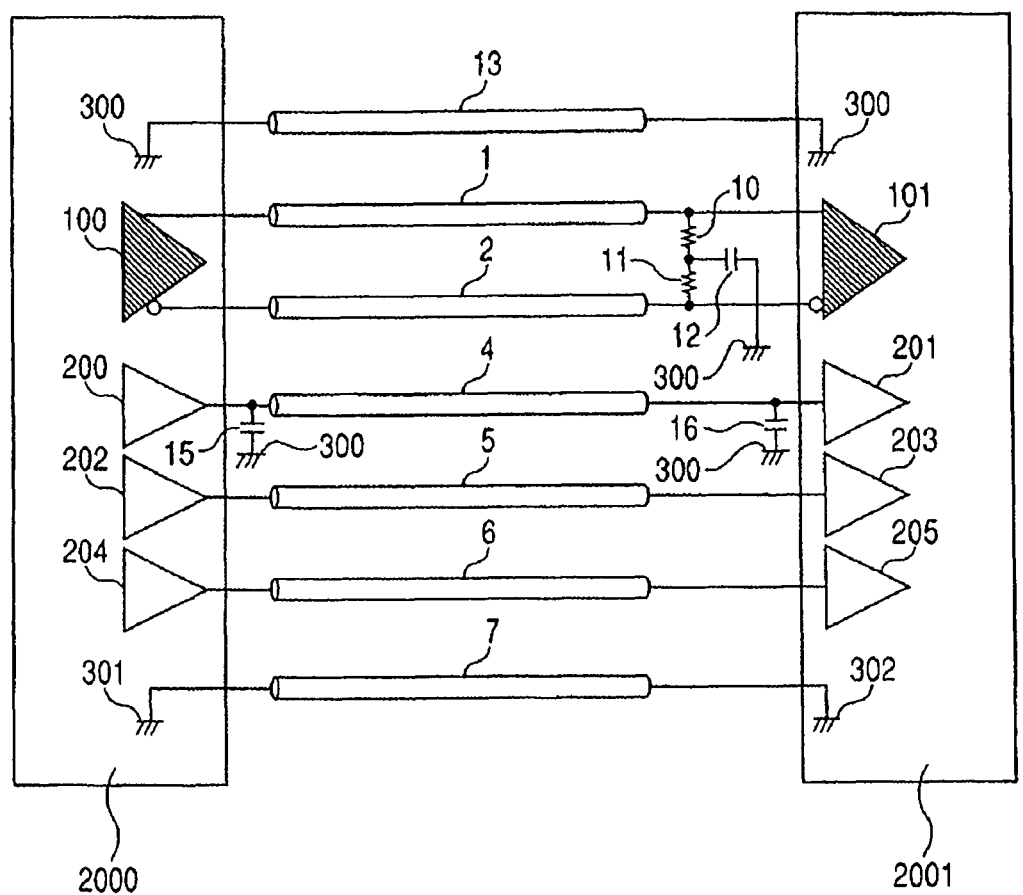
FIG. 5 is a schematic diagram showing another embodiment of the present invention.

Further, as shown in FIG. 5, the transmission side circuit elements 100, 200, 202 and 204 and a ground pattern 301 may be set as different terminals of the same IC package 2000, and the reception side circuit elements 101, 201, 203 and 205 and a ground pattern 302 may be also set as different terminals of the same IC package 2001.

Figure 6:
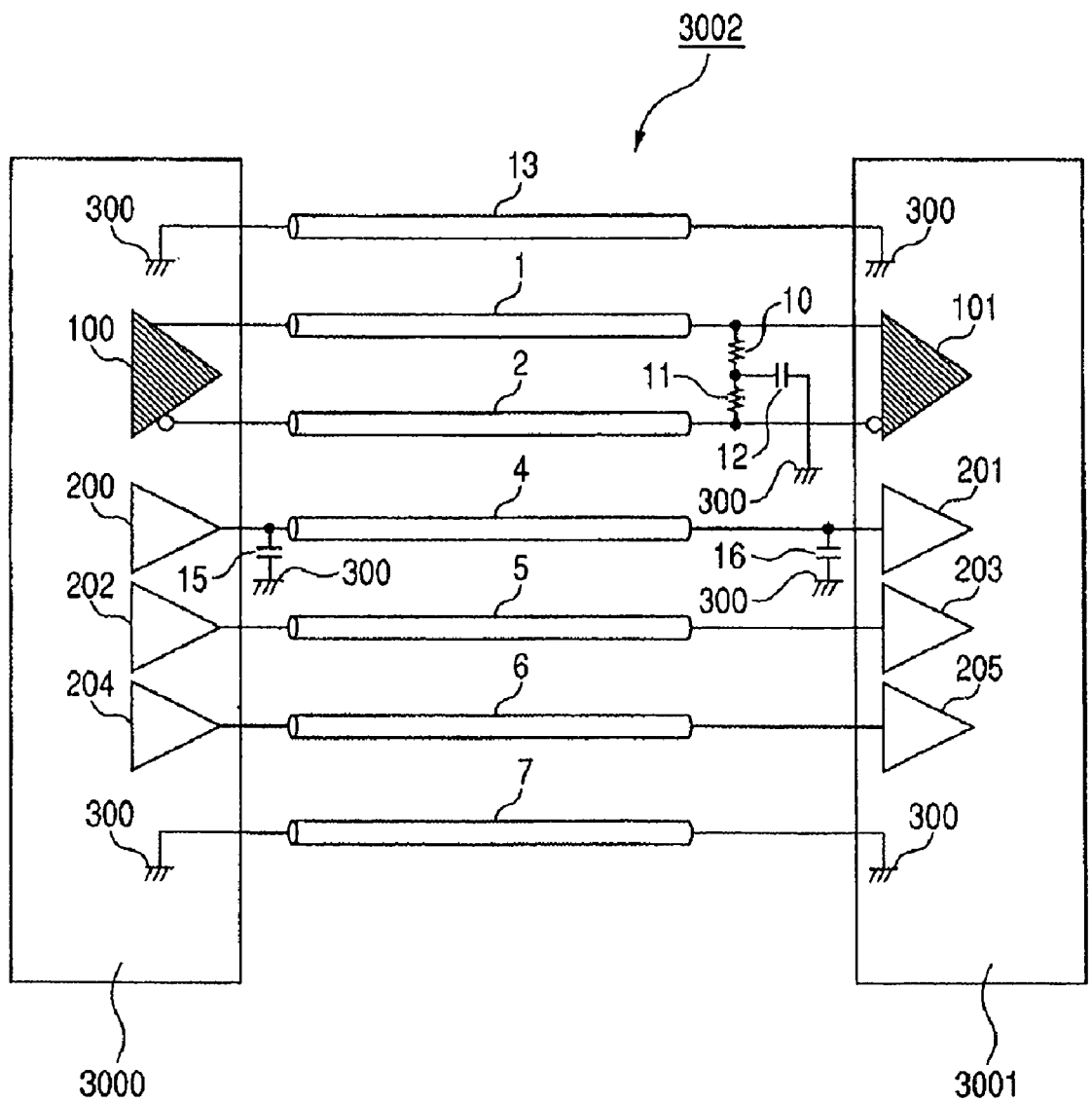
FIG. 6 is a schematic diagram showing still another embodiment of the present invention.

Further, as shown in FIG. 6, the transmission side circuit elements 100, 200, 202 and 204 may be set as different terminals of the same connector 3000, and the reception side circuit elements 101, 201, 203 and 205 may be also set as different terminals of the same connector 3001. In this case, signaling lines 1 to 6 are arranged within a cable 3002.

Experimental Example

In the differential signaling system shown in FIG. 3 according to the second embodiment, a strength of a generated electric field was obtained by simulation.

Figure 7:
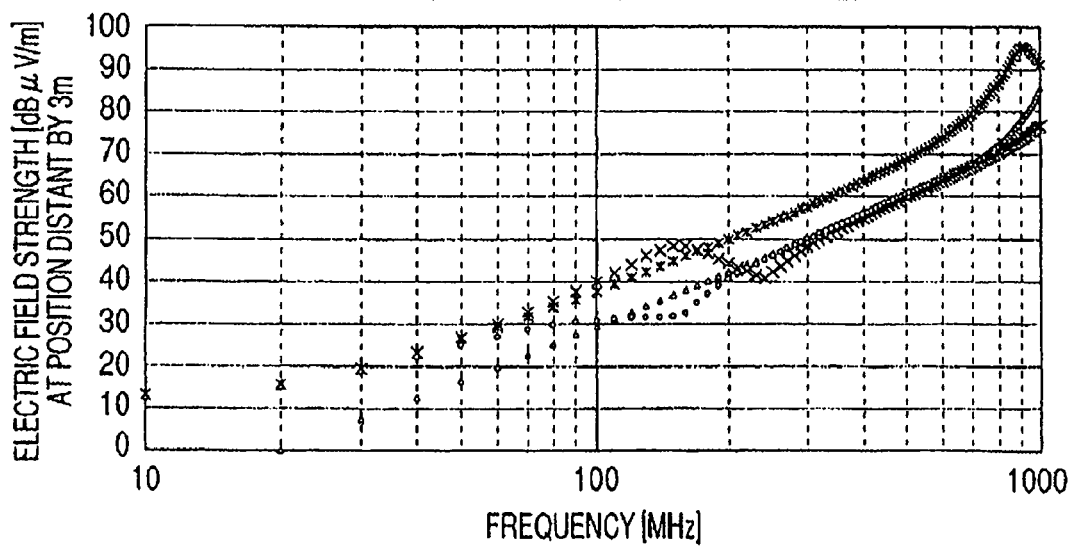
FIG. 7 is a graph showing experimental results according to the present invention.

A structure in which experimental results shown in FIG. 7 were obtained will be described. In each case of a differential signaling system shown in FIGS. 3, 9 and 10, transmission side circuit elements 100, 200, 202 and 204 were arranged on a left side of a printed circuit board 1000, and reception side circuit elements 101, 201, 203 and 205 were arranged on a right side of the printed circuit board 1000. Signaling lines 1, 2, 3, 4, 5, 6, 7 and 13 each have a wire diameter of 0.1 mm and a length of 50 mm. The signaling lines were arranged to be parallel with each other at an interval of 2 mm. Terminating resistors 10 and 11 were set to 50Ω, and a capacitor 12 was set to 0.1 µF, thereby constituting a center tap terminal circuit. Further, the electric field strength obtained in a case where capacitors 15, 16, 17 and 18 were set to 50 pF The strength of the electric field generated in this case is represented as the symbol "o" as shown in FIG. 7. It should be noted that the simulation result indicates the electric field strength obtained when an object to be measured was arranged at a level of 80 cm from a ground pattern surface by the 3m method. Further, the electric field strength obtained in a case where capacitors 15 and 17 were set to 10 pF, and capacitors 16 and 18 were set to 90 pF is indicated as the symbol "x" as shown in FIG. 7. Further, for comparison, the electric field strength in the differential signaling system shown in FIG. 9 is represented as the symbol "*", and the electric field strength obtained in a case where a ground line was arranged at both adjacent sides of the differential signaling line shown in FIG. 10 is represented as the symbol "Δ".

Figure 9:
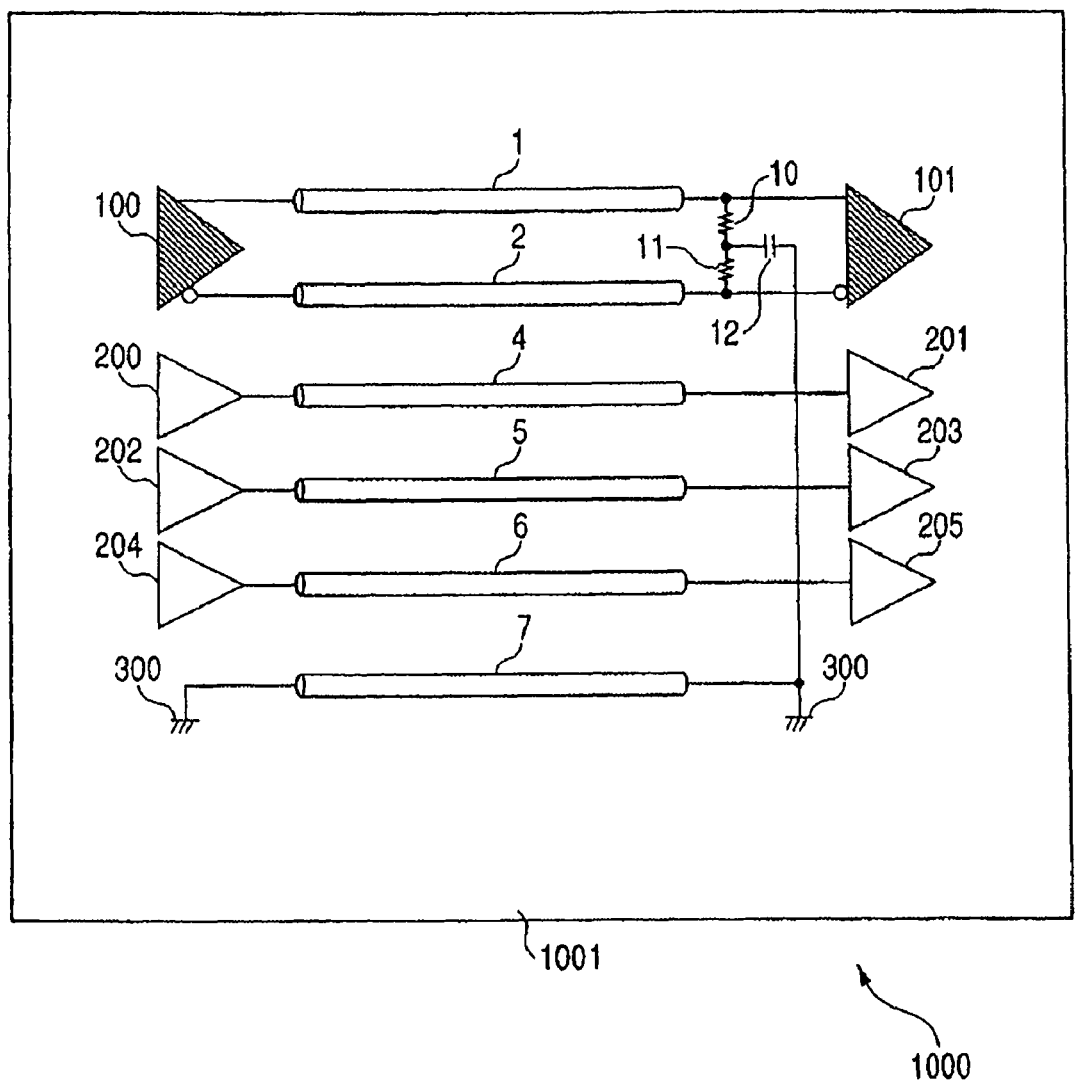
FIG. 9 is a schematic diagram showing the conventional circuit structure.

As apparent from FIG. 7, the electric field strengths of "o" and "x" indicating the differential signaling system according to the present invention are lowered by 10 dB or more as compared with the electric field strength of "1" indicating the conventional differential signaling system shown in FIG. 9, and radiation noise is suppressed to a large extent. In addition, it is apparent that the electric field strengths of "o" and "x" have substantially the same value as compared with the electric field strength of "Δ" indicating the conventional differential signaling system shown in FIG. 10.

Therefore, it is found that it is possible to obtain the same effect of reducing the radiation noise by using an extremely simple method according to the present invention, as compared with the differential signaling system shown in FIG. 10.

This application claims priorities from Japanese Patent Application Nos. 2005-209881 filed on Jul. 20, 2005, and 2006-186912 filed on Jul. 6, 2006, which are hereby incorporated by reference herein.

What is claimed is:

1. A differential signaling structure, comprising:
a transmission side circuit element;
a reception side circuit element;
a pair of differential signaling lines provided between the transmission side circuit element and the reception side circuit element;
a low speed signaling line arranged to be adjacent to and in parallel to the pair of differential signaling lines, for transmitting a signal having a frequency smaller than a frequency of a signal to be transmitted through the pair of differential signaling lines; and
a center tap terminal in a vicinity of an input terminal of the reception side circuit element of the pair of differential signaling lines,
wherein a first capacitive element is connected to the low speed signaling line in a vicinity of an output terminal of the transmission side circuit element and a ground; and
a second capacitive element is connected to the low speed signaling line in a vicinity of the input terminal of the reception side circuit element and the ground.

2. A differential signaling structure according to claim 1, wherein the center tap terminal includes:
   two resistors connected in series with the pair of differential signaling lines, having a resistance value which is about a half of a resistance value matching a differential impedance; and
   a third capacitive element having two ends, one end being connected to a connection point of the two resistors connected in series with each other, and the other end being connected to the ground.

3. A differential signaling structure according to claim 1, wherein the transmission side circuit element and the reception side circuit element are connectors, and the pair of differential signaling lines and the low speed signaling line are arranged within a cable.

4. A differential signaling structure according to claim 1, wherein an impedance obtained by adding capacitance values of the first capacitive element and the second capacitive element is equal to or more than ten times an input impedance of a reception end of the low speed signaling line at a frequency calculated as a reciprocal of twice a minimum pulse width of a signal to be transmitted through the low speed signaling line.

5. A differential signaling structure according to claim 1, wherein the pair of differential signaling lines are arranged between the low speed signaling line and a ground wiring.

6. A differential signaling structure according to claim 1, wherein the low speed signaling line is arranged to be adjacent to both sides of the pair of differential signaling lines, and wherein the low speed signaling line has an impedance equal to an impedance of a ground.

7. A differential signaling structure, comprising:
   a first printed wiring board;
   a transmission side circuit element mounted on the first printed wiring board;
   a second printed wiring board;
   a reception side circuit element mounted on the second printed wiring board;
   a pair of differential signaling lines provided between the transmission side circuit element and the reception side circuit element;
   a low speed signaling line arranged to be adjacent to and in parallel to the pair of differential signaling lines, for transmitting a signal having a frequency smaller than a frequency of a signal to be transmitted through the pair of differential signaling lines; and
   a center tap terminal in a vicinity of an input terminal of the reception side circuit element of the pair of differential signaling lines,
   wherein a first capacitive element is connected to the low speed signaling line in a vicinity of an output terminal of the transmission side circuit element and a ground; and
   a second capacitive element is connected to the low speed signaling line in a vicinity of the input terminal of the reception side circuit element and the ground.

8. A differential signaling structure according to claim 7, wherein the center tap terminal includes two resistors connected in series with the pair of differential signaling lines, having a resistance value which is about a half of a resistance value matching a differential impedance; and
   a third capacitive element having two ends, one end being connected to a connection point of the two resistors connected in series with each other, and the other end being connected to the ground.

9. A differential signaling structure according to claim 8, wherein the transmission side circuit element and the reception side circuit element are connectors, and the pair of differential signaling lines and the low speed signaling line are arranged within a cable.

10. A differential signaling structure according to claim 8, wherein an impedance obtained by adding capacitance values of the first capacitive element and the second capacitive element is equal to or more than ten times an input impedance of a reception end of the low speed signaling line at a frequency calculated as a reciprocal of twice a minimum pulse width of a signal to be transmitted through the low speed signaling line.

11. A differential signaling structure according to claim 8, wherein the pair of differential signaling lines are arranged between the low speed signaling line and a ground wiring.

12. A differential signaling structure according to claim 8, wherein the low speed signaling line is arranged to be adjacent to both sides of the pair of differential signaling lines, and wherein the low speed signaling line has an impedance equal to an impedance of a ground.

* * * * *